United States Patent
Elzeftawi et al.

(10) Patent No.: US 9,806,915 B1
(45) Date of Patent: Oct. 31, 2017

(54) CIRCUIT FOR AND METHOD OF RECEIVING AN INPUT SIGNAL

(71) Applicant: Xilinx, Inc., San Jose, CA (US)

(72) Inventors: Mohamed N. Elzeftawi, San Jose, CA (US); Hongtao Zhang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/194,302

(22) Filed: Jun. 27, 2016

(51) Int. Cl.
| H03B 5/06 | (2006.01) |
| H04B 1/10 | (2006.01) |
| H03G 3/30 | (2006.01) |
| H04L 25/03 | (2006.01) |
| H03B 5/36 | (2006.01) |

(52) U.S. Cl.
CPC ..... H04L 25/03019 (2013.01); H03G 3/3036 (2013.01); H04B 1/10 (2013.01); H03B 5/06 (2013.01); H03B 5/366 (2013.01); H03B 2200/005 (2013.01); H03B 2200/0062 (2013.01)

(58) Field of Classification Search
CPC ...... H03B 2200/005; H03B 2200/0062; H03B 5/06; H03B 5/366
See application file for complete search history.

(56) References Cited

U.S. PATENT DOCUMENTS

| 8,335,249 B1 | 12/2012 | Su et al. | |
| 2009/0096541 A1* | 4/2009 | Tran | H03B 5/06 331/116 FE |
| 2013/0107934 A1 | 5/2013 | Zhou et al. | |
| 2014/0029143 A1* | 1/2014 | Lim | H03F 1/523 361/56 |

FOREIGN PATENT DOCUMENTS

CN 203554504 4/2014

OTHER PUBLICATIONS

Frans, Yohan, et al., "A 56Gb/s PAM4 Wireline Transceiver using a 32-way Time-Interleaved SAR ADC in 16nm rinFET", 2016 Symposia on VLSI Technology and Circuits, Jun. 13-17, 2016,2 pages, Honolulu, HI.*
Healey, Adam, et al., "A Comparison of 25 Gbps NRZ and PAM-4 Modulation used in Legacy and Premium Backplane Channels", White paper, Jan. 2012, pp. 1-16, TE Connectivity, Ltd.
Frans, Yohan, et al., "A 56Gb/s PAM4 Wireline Transceiver using a 32-way Time-Interleaved SAR ADC in 16nm FinFET", 2016 Symposia on VLSI Technology and Circuits, Jun. 13-17, 2016, 2 pages, Honolulu, HI.
Lee, C.H., et al., "Comparison of reciver equalization using first-order and second-order continuous-time Linear Equalizer in 45 nm process technology" Intelligent and Advanced systems (ICIAS), 2012 4th International Conference on IEEE, Jun. 12, 2012, pp. 795-800.

* cited by examiner

*Primary Examiner* — Ross Varndell
(74) *Attorney, Agent, or Firm* — John J. King; Keith Taboada; Carleton Clauss

(57) ABSTRACT

A continuous time linear equalizer comprises an input of a first equalizer path configured to receive a first differential input signal; an input of a second equalizer path configured to receive a second differential input signal; a first programmable load capacitor coupled to an output of the first equalizer path; a second programmable load capacitor coupled to an output of the second equalizer path; and a programmable source capacitor coupled between the first equalizer path and the second equalizer path.

20 Claims, 5 Drawing Sheets

US 9,806,915 B1

CIRCUIT FOR AND METHOD OF RECEIVING AN INPUT SIGNAL

FIELD OF THE INVENTION

The present invention relates generally to data receivers, and in particular, to a circuit for and a method of receiving an input signal.

BACKGROUND OF THE INVENTION

Data transmission is an important aspect of integrated circuit devices. A continuous time linear equalizer (CTLE) may be necessary to receive data, particularly high speed data. Existing CTLE designs for high frequency equalization relies on degeneration resistance to change the amount of relative high-frequency boost. For higher loss channels, more equalization is needed. However, with a conventional CTLE design, the amplitude of the signal is heavily attenuated. In many cases, the signal is already small for high loss channels. This loss in amplitude has to be compensated in a conventional device by requiring more gain from a following Automatic Gain Control (AGC) stage. However, the additional gain requirement in the AGC stage can consume additional power, which is not desirable.

Accordingly, circuits and methods that reduce power when implementing a CTLE are beneficial.

SUMMARY OF THE INVENTION

A continuous time linear equalizer comprises an input of a first equalizer path configured to receive a first differential input signal; an input of a second equalizer path configured to receive a second differential input signal; a first programmable load capacitor coupled to an output of the first equalizer path; a second programmable load capacitor coupled to an output of the second equalizer path; and a programmable source capacitor coupled between the first equalizer path and the second equalizer path.

A method of receiving an input signal is also described. The method comprises receiving a differential input signal; configuring a continuous time linear equalizer to receive a first signal of the differential input signal at a first equalizer input of a first equalizer path and a second signal of the differential input signal at a second equalizer input of a second equalizer path, programming a first programmable load capacitor coupled to a first equalizer path output the continuous time linear equalizer and a second programmable load capacitor coupled to a second equalizer path output; and programming a programmable source capacitor coupled between the first equalizer path and the second equalizer path; providing a high frequency gain boost with a fixed DC gain; and coupling an output to first and second outputs of the continuous time linear equalizer.

Other features will be recognized from consideration of the Detailed Description and the Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

A continuous-time linear equalizer is designed to provide high frequency gain boost with a fixed DC or low frequency gain. Programmable capacitors and resistors are implemented to set peaking frequencies. As will be described in more detail below, both a load capacitor and a source capacitor are tuned to achieve a desirable peak frequency. The circuits and methods decrease the required gain from an automatic gain control stage (AGC) following a CTLE, and thus save power.

Figure 1:
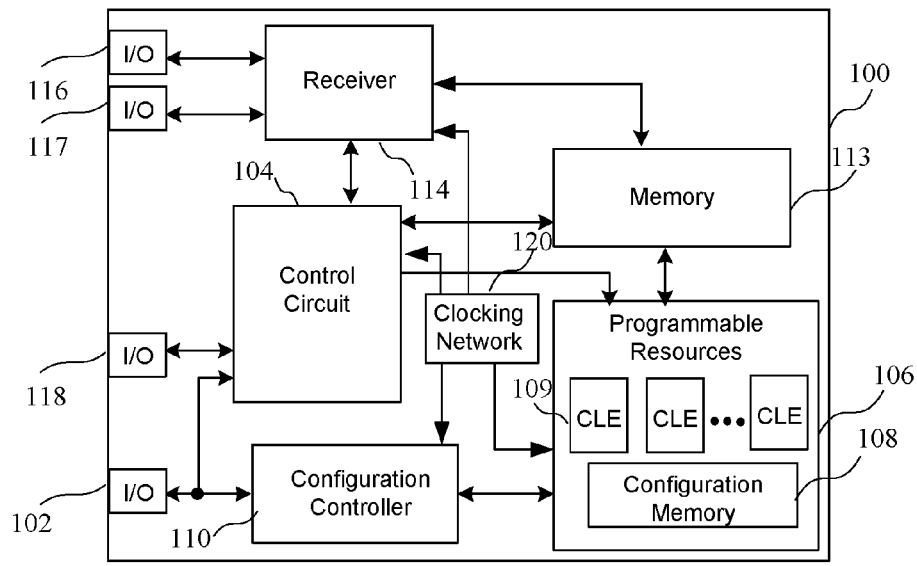
FIG. 1 is a block diagram of an integrated circuit comprising a circuit for receiving data in the integrated circuit.

Turning first to FIG. 1, a block diagram of an integrated circuit 100 comprising a circuit for routing data in the integrated circuit is shown. In particular, an input/output port 102 is coupled to a control circuit 104 that controls programmable resources 106 having configurable logic elements 109. Configuration data may be provided to the configuration memory 108 by a configuration controller 110. The configuration data enables the operation of the programmable resources 106. A memory 113 may be coupled to the control circuit 104 and the programmable resources 106. A receiver circuit 114 may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1.

Figure 2:
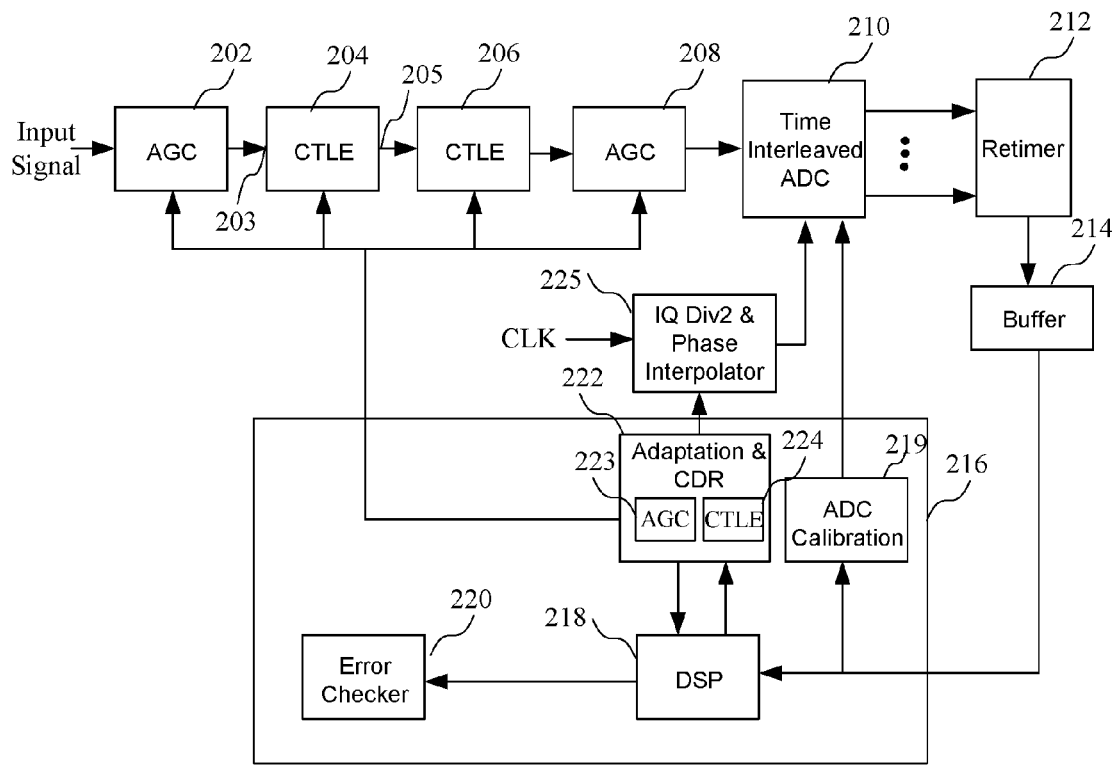
FIG. 2 is a block diagram of a receiver for receiving data.

Turning now to FIG. 2, a block diagram of a receiver for receiving data is shown. The elements of FIG. 2 could be implemented in one or more elements of FIG. 1, such as the receiver and control circuit of FIG. 1. As shown in FIG. 2, an AGC circuit 202 is configured to receive an input signal, an output of which is coupled to an input 203 of a first CTLE 204 having an output 205 and a second CTLE 206. An output of the second CTLE 206 is coupled to an AGC circuit 208, an output of which is coupled to a time interleaved analog-to-digital converter (ADC) 210. It should be noted that the circuit of FIG. 2 includes 2 AGC circuits and 2

CTLE circuits to achieve the required gain and peaking, respectively. The CTLEs may be identical, where each may be implemented as described below. The AGC 202 is placed in front to reduce a noise contribution at the subsequent stages.

The digital outputs generated by the time interleaved ADC 210 are provided to a retimer circuit 212, an output of which is provided to a buffer 214. The buffered digital outputs are provided to a control circuit 216. The control circuit 216, which may be a field programmable gate array (FPGA) for example, may be implemented on the integrated circuit 100, or may be implemented as a separate integrated circuit. The digital values are provided to a digital signal processing (DSP) circuit 218 and an ADC calibration circuit 219. An output of the DSP 218 is provided to an error checker 220, which performs error checking of the received input signal. The ADC calibration circuit 219 enables calibration of the Time Interleaved ADC circuit 210. An adaptation and clock and data recovery (CDR) circuit 222, comprising an AGC adaptation circuit 223 and a CTLE adaptation circuit 224, receives an output of the DSP circuit 218 and is used to control an IQ divide-by-2 and phase interpolator circuit 225. The AGC adaptation circuit 223 controls adaptation of the ACG circuit and a CTLE circuit 224 controls adaptation of the CTLE adaptation circuit 224. The IQ divide-by-2 and phase interpolator circuit 225 is controlled by adaptation and CDR circuit 222, and generates a correct phase of a clock signal based upon a reference clock signal (CLK). The adaptation and CDR circuit also controls parameters of the ADC and CTLE circuits.

The 4 stages of CTLE and AGC of the analog front-end provides signal equalization and conditioning which reduces the resolution and full-scale-range requirement of the ADC. By way of example, the 28 GSa/s ADC converts the differential analog input into 8-bit digital values. The ADC outputs are sampled periodically and stored in a storage element, such as a 64 Kb storage that stores 8K symbols for example. The control circuit 216 may be an off-chip FPGA that is used to take these 8K symbols, performs DSP, and generates equalized symbols. The DSP inside the FPGA may consist of a 24-tap FFE and a 1-tap DFE. The FPGA may also perform equalization, adaptation, clock recovery (CDR), and ADC offset/gain/skew calibrations based on sampled ADC outputs.

Figure 3:
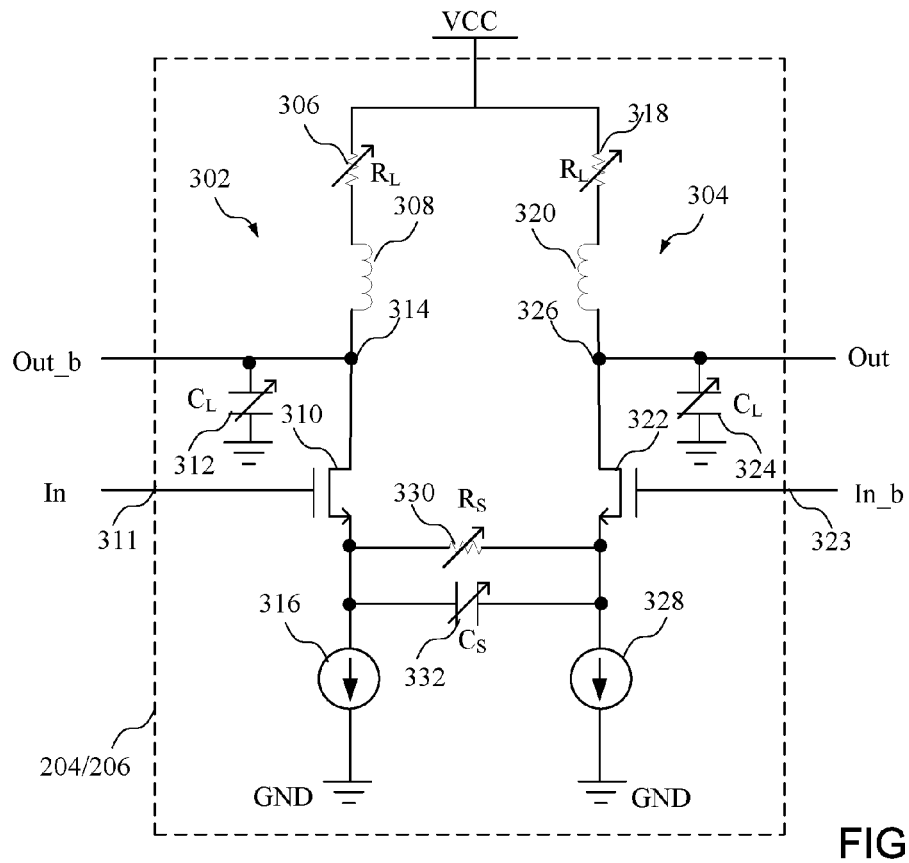
FIG. 3 is a block diagram of a continuous time linear equalizer of the receiver of FIG. 2.

Turning now to FIG. 3, a block diagram of a continuous time linear equalizer of the receiver of FIG. 2 is shown. The CTLE circuit 204/206 comprises a first equalizer path 302 and a second equalizer path 304. The first equalizer path 302 comprises a first programmable load resistor 306 (having a resistance $R_L$) coupled between a reference voltage, shown here as VCC, and an inductor 308 (having an inductance L). It should be noted that the inductors of FIG. 3 could be passive inductors or T-Coil inductors for example. The inductor could be a shunt peaking inductor as shown or a series peaking inductor, where the load is a resistor and the output of the continuous time linear output is provided through an inductor to the next stage. However, it should be understood that the circuits could be implemented without the inductors. A transistor 310, shown here as an NMOS transistor, is coupled in the first equalizer path to a first programmable load capacitor 312 (having a capacitance $C_L$) at node 314. A gate of the transistor 310 is coupled to a first input 311 of the CTLE to receive a first signal of the differential input signal. A current source 316 is also coupled in series between the transistor 310 in the first equalizer path 302 and a ground (GND) potential.

The second equalizer path 304 comprises a second programmable load resistor 318 (having a resistance $R_L$) coupled between the reference voltage and an inductor 320 (having an inductance L). A transistor 322 is also coupled in the second equalizer path to a second programmable load capacitor 324 (having a capacitance $C_L$) at node 326. A gate of the transistor 322 is coupled to a second input 323 of the CTLE to receive a second signal of the differential input signal. A current source 328 is also coupled in series between the transistor 322 in the second equalizer path 304 and the ground potential. The current sources may be programmed to keep a constant current output common mode. A third programmable source resistor 330 (having a resistance $R_S$) and a third programmable source capacitor 332 (having a capacitance $C_S$) are coupled in parallel between the sources of the transistors 310 and 322. The programmable source resistor is a degeneration resistor that may be programmed to track $R_L$ and maintain a fixed DC gain. The load resistances $R_L$ are adjusted to retain the desired bandwidth, then $R_S$ is adjusted to achieve the desired fixed DC gain. As will be described in more detail below in reference to the AC curve of FIG. 4, the programmable resistors and capacitors are programmed to set peak frequencies.

It should be noted that if the capacitance of the source capacitor 332 is changed, both $\omega_{z1}$ and $\omega_{p1}$ will change, where $\omega_{z1} = 1/(R_S C_S)$, and $\omega_{p1} = (1 + g_m R_S/2)/(R_S C_S)$;

where $g_m$ is the transconductance of the transistor in the equalizer path. However, the peaking frequency, $\omega_{peak}$, will change. In order to keep $\omega_{peak}$ the same, $\omega_{p2}$ is changed in the opposite direction (by tuning the load capacitors 312 and 324), where $\omega_{z2} = R_L/L$, and $\omega_{p2} = 1/\sqrt{L \cdot C_L}$.

Figure 4:
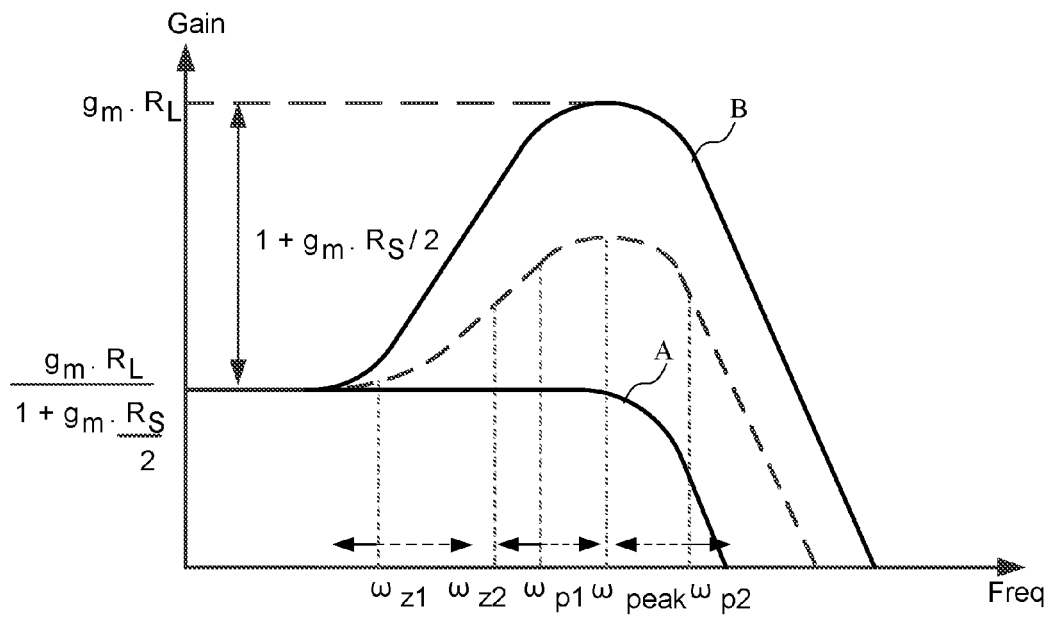
FIG. 4 is a plot showing a CTLE's gain as a function of frequency.

For the minimum peaking setting, the source capacitance is the smallest and the load capacitance are the largest, moving $\omega_{z1}$, $\omega_{p1}$, and $\omega_{p2}$ associated with the zeros and poles along dashed arrows to achieve the curve A. For maximum peaking setting, the source capacitance is the largest and the load capacitances are the smallest, moving $\omega_{z1}$, $\omega_{p1}$, and $\omega_{p2}$ along solid arrows to achieve the curve B. As shown in FIG. 4, the gain starts from $g_m R_L/(1 + g_m(R_S/2))$ until it reaches the first zero $\omega_{z1}$, then it rises unit it reaches $\omega_{p1}$, when it reaches $\omega_{p2}$, where the gain drops again. To achieve curve A, $\omega_{z1}$ is moved to a very high frequency and $\omega_{p2}$ is moved to a low frequency. As a result, the gain curve does not hit $\omega_{z1}$ and thus the gain does not rise. Intermediate settings can be obtained as illustrated from the dashed curve in between the two peaking extremes. The source resistor 330 may be kept constant and matched to the load resistors 306 and 318. It fixes the DC gain for all peaking settings at a certain desired value, such as at 0 dB for example. It should be noted that the load resistance RL may be programmed to keep a constant bandwidth over process corners. For linearity purposes, such as for a pulse amplitude modulation 4 (PAM4) application for example, it would be beneficial to use voltage-independent capacitors. For example, Metal-Oxide-Metal (MOM) capacitors which are formed in the lower metal layers, and therefore form a compact design, could be used. Alternatively, Metal-insulator-Metal (MiM) capacitors, which generally reside in higher metal layers, could be used.

The CTLE is designed to have a constant-DC gain of approximately 0 dB and programmable high-frequency peaking, while the AGC has a 10 dB programmable DC gain range. Compared to a constant high-frequency gain CTLE with programmable DC gain of a conventional device, the constant-DC gain CTLE can either reduce the required AGC's gain at high-loss channels and/or improve the linearity of subsequent stage at low-loss channels. Furthermore, the circuits and methods as described in reference to FIG. 3 minimize interaction between the AGC adaptation loop and the CTLE adaptation loop. That is, every time the CTLE's peaking code changes in a conventional device, the DC gain changes. Thus the AGC's code has to change to compensate for the CTLE's peaking code changes. By implementing the circuit of FIG. 3, when the CTLE's code changes, the DC gain remains the same and thus the AGC code doesn't need to change. Therefore, maintaining a constant DC gain minimizes the interaction between an AGC adaptation loop and a CTLE adaptation loop. While the circuit of FIG. 3 is implemented with NMOS transistors, the circuit could be implemented with PMOS transistors, as will be described in reference to FIG. 8.

Figure 5:
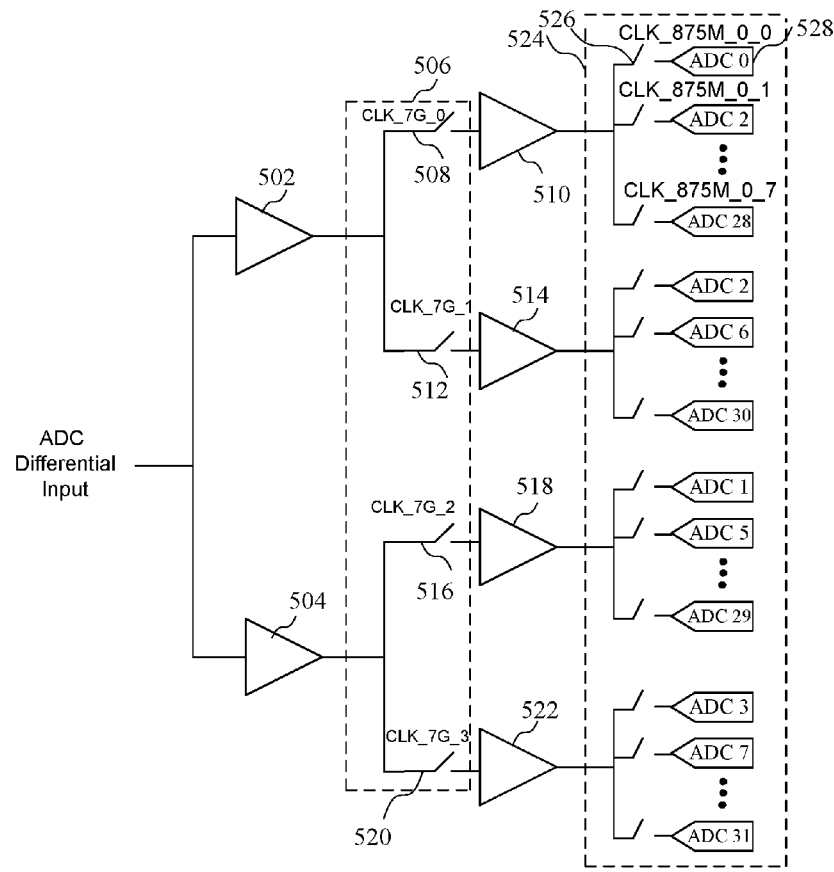
FIG. 5 is a block diagram of circuit having time interleaved analog-to-digital converter circuits.

Turning now to FIG. 5, a block diagram of circuit having time-interleaved analog-to-digital converter circuits is shown. According to the implementation of FIG. 5, there are two stages of time-interleaving. The first stage is a 4-way time-interleaver, where the input is sampled and held using four-phase, non-overlapping clock signals, such as 7 GHz clocks. The ADC differential input signal is provided to a first buffer 502 and a second buffer 504, outputs of which are provided to a timing control circuit 506. A first switch 508 is controlled by a first clock signal to apply the output of the buffer 502 to a buffer 510 and a second switch 512 is controlled by a second clock signal to apply the output of the buffer 502 to a buffer 514. A third switch 516 is controlled by a third clock signal to apply the output of the buffer 504 to a buffer 518 and a fourth switch 520 is controlled by a fourth clock signal to apply the output of the buffer 504 to a buffer 522.

Figure 6:
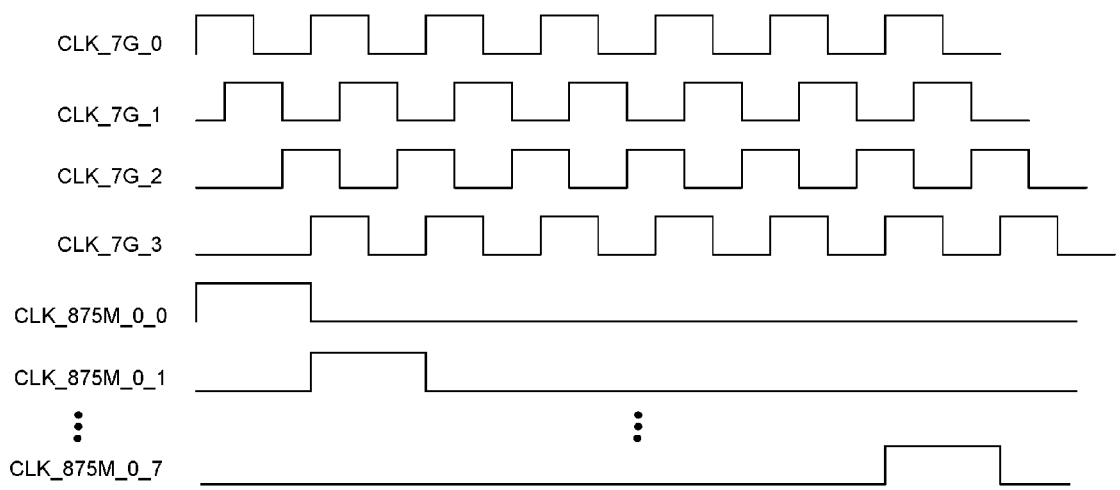
FIG. 6 is a timing diagram showing clock signals required by the time interleaved analog-to-digital converter circuits of FIG. 5.

A second stage 524 is an 8-way time-interleaver, where each of the signals sampled by the 4-phase, non-overlapping clock signals are further sampled and held using 8-phase 875 MHz clocks and converted to digital values using 8 instances of a clock signal, such as an 875 MHz SAR ADC clock signal. As shown in FIG. 5, each ADC 528 is controlled by a corresponding switch 526. The output of the 32 instances of SAR ADCs are then re-timed to a single clock domain and sent to a storage element, such as a 64 Kb storage element. The ADC clocking timing diagram is shown in FIG. 6. The timing skew calibration of the 7 GHz clocks and the gain/offset calibration of the 875 MHz ADC instances are performed using pseudo-random data inputs, for example.

Figure 7:
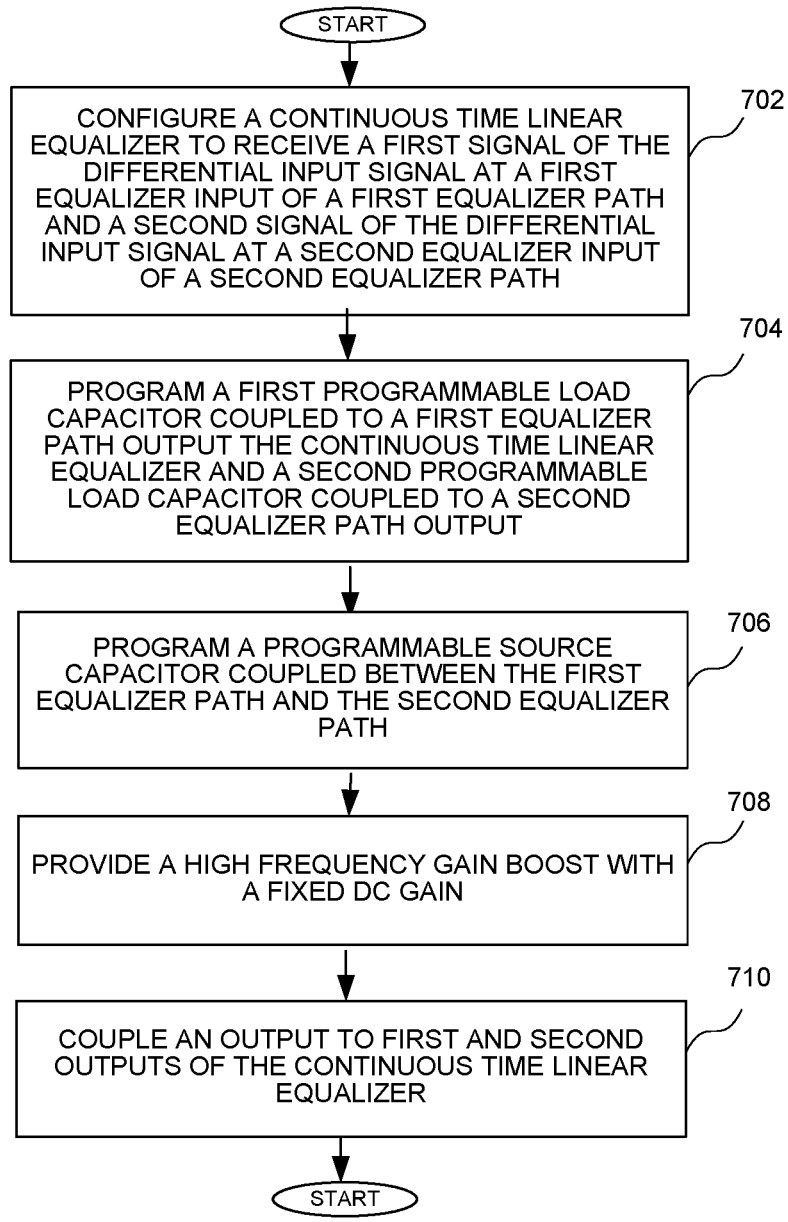
FIG. 7 is a flow chart showing a method of receiving data.

Turning now to FIG. 7, a flow chart shows a method of receiving data, and may be implemented using the circuits of FIGS. 1-6, for example, or other suitable circuits. In particular, a continuous time linear equalizer is configured to receive a first signal of the differential input signal at a first equalizer input of a first equalizer path and a second signal of the differential input signal at a second equalizer input of a second equalizer path at a block 702. The first and second equalizer paths may be the first and second equalizer paths of FIG. 3, for example. A first programmable load capacitor, such as capacitor 312, coupled to a first equalizer path output of the continuous time linear equalizer and a second programmable load capacitor, such as capacitor 322, coupled to a second equalizer path output are programmed at a block 704. A programmable source capacitor 322 coupled between the first equalizer path and the second equalizer path is programmed at a block 706. By implementing the programmable resistors and capacitors such as shown in FIG. 3, a high frequency gain boost is provided with a fixed DC gain at a block 708. An output is coupled to first and second outputs of the continuous time linear equalizer at a block 710. The method of FIG. 7 may implement other elements as described above in reference to FIG. 3, such as controlling the values of the load resistances, source resistance and current sources of the circuit of FIG. 3.

Figure 8:
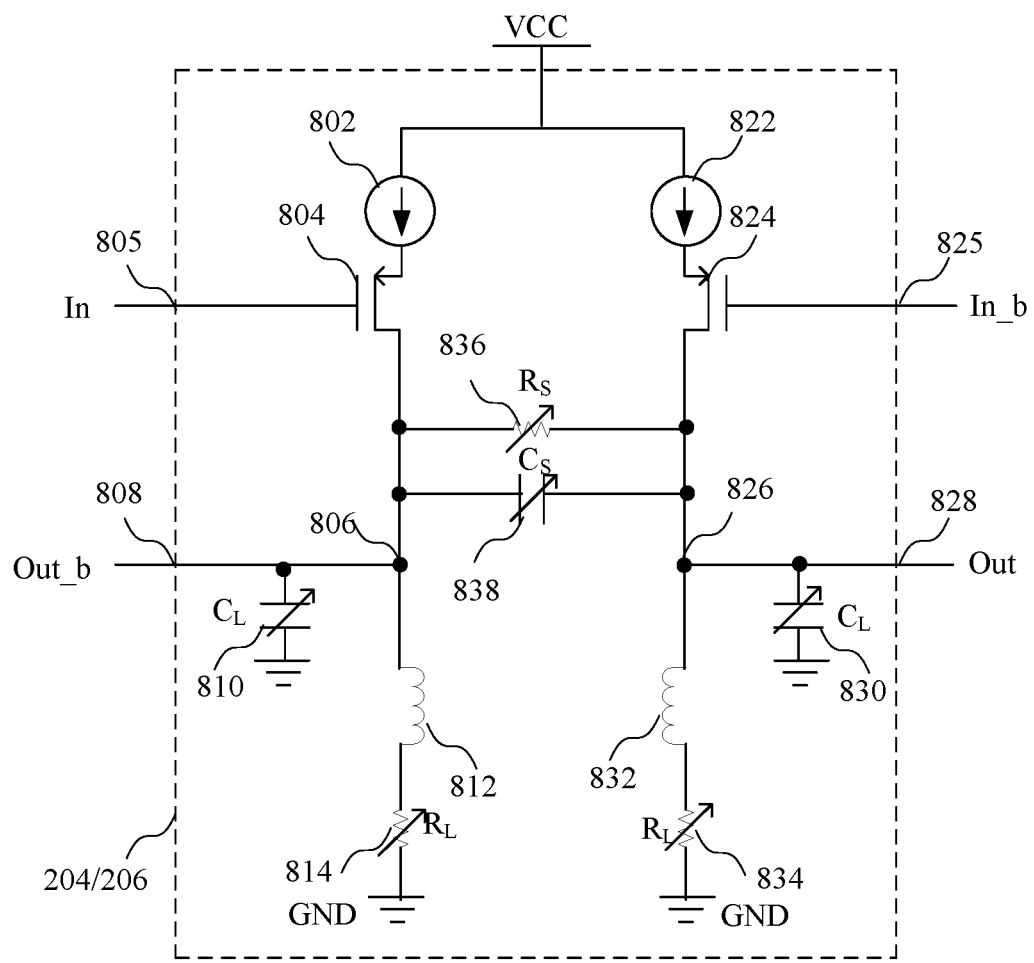
FIG. 8 is another block diagram of a continuous time linear equalizer of the receiver of FIG. 2.

Turning now to FIG. 8, another block diagram of a continuous time linear equalizer of the receiver of FIG. 2 having PMOS transistors is shown. As shown in FIG. 8, the continuous time linear equalizer comprises two current path including a first current path having a current source 802 coupled between VCC and a PMOS transistor 804 having a gate coupled to an input 805 that receives the input signal (In). A node 806 at the drain of the transistor 804 is coupled to an inverted output 808 to generate an output signal (Out_b). A load capacitor ($C_L$) 810 is coupled between the node 806 and ground. An inductor 812 and a programmable load resistor 814 is coupled in series between the node 806 and ground. A second current path has a current source 822 coupled between VCC and a PMOS transistor 824 having a gate coupled to an input 825 that receives the inverse input signal (In_b). A node 826 at the drain of the transistor 824 is coupled to an output 828 to generate an output signal (Out). A load capacitor ($C_L$) 830 is coupled between the node 826 and ground. An inductor 832 and a programmable load resistor 834 is coupled in series between the node 826 and ground. A programmable source resistor 836 and a programmable source capacitor 838 are provided between the nodes 806 and 826. The circuit of FIG. 8 would be implemented as described above in reference to FIG. 3.

It can therefore be appreciated that new circuits for and methods of receiving an input signal have been described. It will be appreciated by those skilled in the art that numerous alternatives and equivalents will be seen to exist that incorporate the disclosed invention. As a result, the invention is not to be limited by the foregoing embodiments, but only by the following claims.

We claim:

1. A continuous time linear equalizer comprising:
   an input of a first equalizer path configured to receive a first signal of a differential input signal;
   an input of a second equalizer path configured to receive a second signal of a differential input signal;
   a first programmable load capacitor coupled to an output of the first equalizer path;
   a second programmable load capacitor coupled to an output of the second equalizer path; and
   a programmable source capacitor coupled between the first equalizer path and the second equalizer path.

2. The continuous time linear equalizer of claim 1 further comprising a first programmable load resistor coupled between the first equalizer path output and a voltage reference potential and a second programmable load resistor coupled between the second equalizer path output and the voltage reference potential.

3. The continuous time linear equalizer of claim 2 further comprising a first inductor coupled between the first programmable load resistor and the first equalizer path output and a second inductor coupled between the second programmable load resistor and the second equalizer path output.

4. The continuous time linear equalizer of claim 1 further comprising a source resistor coupled in parallel with the source capacitor between the first equalizer path and the second equalizer path.

5. The continuous time linear equalizer of claim 1 wherein the first equalizer path comprises a first transistor configured to receive the first signal of the differential input signal at a gate of the first transistor, and the second equalizer path comprises a second transistor configured to receive the second signal of the differential input signal at a gate of the second transistor.

6. The continuous time linear equalizer of claim 5 further comprising a first programmable current source coupled between the first transistor and a ground potential and a second programmable current source coupled between the second transistor and the ground potential.

7. The continuous time linear equalizer of claim 1 wherein a peaking frequency of an output signal of the continuous time linear equalizer is set by the first programmable load capacitor, the second programmable load capacitor and the programmable source capacitor.

8. The continuous time linear equalizer of claim 7 further comprising an automatic gain control circuit configured to control a gain of the input signal, and an automatic gain control adaptation circuit configured to control an adaptation of the automatic gain control circuit.

9. The continuous time linear equalizer of claim 8 further comprising a continuous time linear equalizer adaptation circuit configured to control an adaptation of the continuous time linear equalizer.

10. The continuous time linear equalizer of claim 1 wherein the input signal comprises a PAM4 signal.

11. A method of receiving an input signal, the method comprising:
receiving a differential input signal;
configuring a continuous time linear equalizer to receive a first signal of the differential input signal at a first equalizer input of a first equalizer path and a second signal of the differential input signal at a second equalizer input of a second equalizer path;
programming a first programmable load capacitor coupled to a first equalizer path output of the continuous time linear equalizer and a second programmable load capacitor coupled to a second equalizer path output of the continuous time linear equalizer; and
programming a programmable source capacitor coupled between the first equalizer path and the second equalizer path;
providing a high frequency gain boost with a fixed DC gain; and
coupling an output signal to first and second outputs of the continuous time linear equalizer.

12. The method of claim 11 further comprising setting a resistance of a first programmable load resistor coupled between the first equalizer path output and a voltage reference potential, and setting a resistance of a second programmable load resistor coupled between the second equalizer path output and the voltage reference potential.

13. The method of claim 12 further comprising coupling a first inductor between the first programmable load resistor and the first equalizer path output and coupling a second inductor between the second programmable load resistor and the second equalizer path output.

14. The method of claim 11 further comprising setting a resistance of a source resistor coupled in parallel with the source capacitor between the first equalizer path and the second equalizer path.

15. The method of claim 11 further comprising receiving the first signal of the differential input signal at a gate of a first transistor and receiving the second signal of the differential input signal at a gate of a second transistor.

16. The method of claim 15 further comprising coupling a first programmable current source between the first transistor and a ground potential, and coupling a second programmable current source between the second transistor and a ground potential.

17. The method of claim 11 further comprising setting a peaking frequency of the output signal of the continuous time linear equalizer using the first programmable load capacitor, the second programmable load capacitor and the programmable source capacitor.

18. The method of claim 17 further comprising configuring an automatic gain control circuit to control a gain of the input signal, and configuring an automatic gain control adaptation circuit to control an adaptation of the automatic gain control circuit.

19. The method of claim 18 further comprising configuring a continuous time linear equalizer adaptation circuit to control an adaptation of the continuous time linear equalizer.

20. The method of claim 11 wherein receiving a differential input signal comprises receiving a PAM4 signal.

* * * * *